(12) United States Patent
Cocchini et al.

(10) Patent No.: US 9,702,906 B2
(45) Date of Patent: Jul. 11, 2017

(54) NON-PERMANENT TERMINATION STRUCTURE FOR MICROPROBE MEASUREMENTS

(71) Applicant: International Business Machines Corporation, Armonk, NY (US)

(72) Inventors: Matteo Cocchini, Long Island City, NY (US); Michael A. Cracraft, Poughkeepsie, NY (US); Jayapreetha Natesan, Hopewell Junction, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 14/751,792

(22) Filed: Jun. 26, 2015

(65) Prior Publication Data
US 2016/0377654 A1    Dec. 29, 2016

(51) Int. Cl.
*G01R 1/067* (2006.01)
*G01R 1/04* (2006.01)
*G01R 31/28* (2006.01)

(52) U.S. Cl.
CPC ..... *G01R 1/06794* (2013.01); *G01R 1/06744* (2013.01); *G01R 1/06755* (2013.01); *G01R 31/2887* (2013.01); *G01R 1/0408* (2013.01); *G01R 31/2893* (2013.01)

(58) Field of Classification Search
CPC .............. G01R 1/0408; G01R 31/2891; G01R 31/2886; G01R 31/2887; G01R 31/2893
USPC ...................................................... 324/750.2
See application file for complete search history.

(56) References Cited

U.S. PATENT DOCUMENTS

| 3,970,934 | A | | 7/1976 | Aksu | |
|---|---|---|---|---|---|
| 4,164,704 | A | * | 8/1979 | Kato | ............... G01R 1/07328 324/72.5 |
| 4,636,722 | A | | 1/1987 | Ardezzone | |
| 4,735,421 | A | * | 4/1988 | Neef | ..................... F16J 15/46 277/312 |
| 4,980,754 | A | * | 12/1990 | Kotani | ................. H01L 23/445 174/15.4 |
| 5,366,380 | A | * | 11/1994 | Reymond | ............... H01L 24/72 257/E23.078 |
| 5,532,903 | A | * | 7/1996 | Kendall | .................. G03F 7/707 361/234 |
| 5,635,846 | A | | 6/1997 | Beaman et al. | |
| 5,841,291 | A | * | 11/1998 | Liu | ..................... G01R 1/0735 324/755.09 |
| 5,847,569 | A | | 12/1998 | Ho et al. | |

(Continued)

FOREIGN PATENT DOCUMENTS

EP        0230348 A2      1/1987

OTHER PUBLICATIONS

IBM, List of IBM Patents or Patent Applications Treated as Related, Appendix P, dated Feb. 28, 2016 , 2 pages.

(Continued)

*Primary Examiner* — Jermele M Hollington
*Assistant Examiner* — Christopher McAndrew
(74) *Attorney, Agent, or Firm* — Reza Sarbakhsh (57) ABSTRACT

A structure and method of facilitating testing of an electronic device (device under test or DUT) using a non-permanent and reusable structure to terminate contact pads and contact pin holes on a surface of the DUT.

10 Claims, 6 Drawing Sheets

(56) References Cited

U.S. PATENT DOCUMENTS

| | | | |
|---|---|---|---|
| 6,255,832 B1 | 7/2001 | Notohardjono et al. | |
| 6,307,390 B1* | 10/2001 | Akaike | G01R 31/2851 |
| | | | 324/750.2 |
| 6,317,647 B1* | 11/2001 | Akaike | H01L 21/682 |
| | | | 324/750.15 |
| 6,319,354 B1* | 11/2001 | Farnworth | B28D 5/0094 |
| | | | 156/707 |
| 6,603,322 B1 | 8/2003 | Boll et al. | |
| 6,794,889 B2* | 9/2004 | Jafari | G01R 31/2886 |
| | | | 324/750.23 |
| 7,172,431 B2 | 2/2007 | Beaman et al. | |
| 7,471,096 B2* | 12/2008 | Kohashi | G01R 1/0466 |
| | | | 324/750.2 |
| 8,236,151 B1* | 8/2012 | Olson | C25D 17/005 |
| | | | 204/286.1 |
| 2003/0201764 A1* | 10/2003 | Jafari | G01R 31/2886 |
| | | | 324/750.23 |
| 2005/0193576 A1* | 9/2005 | Hollman | G01R 31/2891 |
| | | | 33/286 |
| 2007/0290703 A1* | 12/2007 | Hollman | G01R 1/07392 |
| | | | 324/750.14 |

OTHER PUBLICATIONS

Pending U.S. Appl. No. 14/841,775, filed Sep. 1, 2015, Entitled: "Non-Permanent Termination Structure for Microprobe Measurements".

Anonymous, "A Flexible Z-Axis Compression Test Head", IP.com No. 000060264D, Feb. 16, 2005.

* cited by examiner

NON-PERMANENT TERMINATION STRUCTURE FOR MICROPROBE MEASUREMENTS

BACKGROUND

Embodiments of the present invention relate generally to testing of electronic devices, and more particularly to a structure and method of terminating contact terminals of an electronic device under test (DUT).

Electronic devices such as integrated circuits (IC) chips and printed circuit boards, among others, are tested before they are packaged in an electronic product, such as a computer. Testing is essential to determine whether an electronic device's electrical characteristics conform to the specifications to which it was designed to and performs the function for which it was designed. A wafer prober is often used to test electronic devices. The wafer prober typically includes a set of microscopic contacts or probes that are moved into electrical contact with appropriate contact terminals on a device under test (DUT).

SUMMARY

According to an embodiment of the invention, a method of terminating one or more electrical contact locations on an electronic device is provided. The method may include creating a first electrical contact between a first end of a contact element mechanically coupled with a platform and a surface mount technology (SMT) component; and creating a second electrical contact between a second end of the contact element and an electric contact location on an electronic device, wherein a non-conductive vacuum suction membrane adheres to a surface of the electronic device by suction force to facilitate the second electrical contact, wherein the non-conductive vacuum suction membrane is mechanically coupled with an end of a non-conductive screw, wherein the screw has at least a portion housed within the platform.

According to another embodiment of the invention, a method of testing an electronic device is provided. The method may include creating a first electrical contact between a first end of a contact element mechanically coupled with a platform and a surface mount technology (SMT) component; creating a second electrical contact between a second end of the contact element and a first electric contact location on an electronic device, wherein a non-conductive vacuum suction membrane adheres to a surface of the electronic device by suction force to facilitate the second electrical contact, wherein the non-conductive vacuum suction membrane is mechanically coupled with an end of a non-conductive screw, wherein the screw has at least a portion housed within the platform; sending an electrical pulse to a second electric contact location on the electronic device; and receiving a reflected response pulse corresponding to the sent electrical pulse.

According to another embodiment, a structure for making electrical contact with one or more electrical contact locations of an electronic device is provided. The structure may include a non-conductive platform; a non-conductive screw having at least a portion housed within the platform; a non-conductive vacuum suction membrane mechanically coupled with an end of the screw; and a contact element mechanically coupled with the platform, wherein a first end of the contact element is in electrical contact with a surface mount technology (SMT) component, and a second end extends out of a surface of the platform.

BRIEF DESCRIPTION OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Electronic devices are tested before they are packaged in a final product, such as a computer. Before testing commences, one or more electronic devices to be tested (the device under test or "DUT") is typically laid on a substrate carrier and clamped fixed on the substrate carrier. A wafer prober may then make electrical contact with contact pads located on the DUT and impact the contact pads with measuring signals and the reaction to these measuring signals is measured. The wafer prober includes one or more test probes provided for contacting contact pads or signal pin holes of the DUT with each test probe's tip aligned to a contact pad location on the DUT. Contemporary probe tips are small and generally fragile and easily deformed or damaged from large displacement or mechanical jarring.

While a wafer probe's tips are small, the body of the probes and the mechanical support required to hold the probe testing setup in place may be somewhat bulky. This may limit access by the probes of wafer probe to all the contact pads or signal pin holes that may need to be contacted at the same time. For example, only four probes may be capable of being contacted by the probes of the wafer probe in any one small area of a DUT when measurements may need to be taken simultaneously from more than four ports, for example, eight ports. So, when 8-port measurements need to be taken with a 4-port probe wafer probe set-up, the four unused ports may need to be properly terminated in order to obtain valid measurements from the four ports being accessed by the probes, with these ports being in the form of contact pads or contact pin holes.

Consequently, a mechanism capable of terminating the four unused ports while not obstructing the probe placement for the four ports where measurement are taken may be required. One traditional solution to temporarily terminate the four unused ports is to solder very small surface mounted resistors across the four unused ports or pads to provide the needed termination while measurements are undertaken in the other four ports by the probes of the wafer probe. This approach may be time consuming. In addition, when the solder material is removed after conclusion of the testing, it may often result in permanent damage to the ports making it impossible to take measurements in the previously soldered ports. This approach may also result in residues being left over after the solder material has been removed, which may affect the DUT's performance. Additionally, the high temperature associated with solder removal may cause permanent damage to components of the DUT nearby the area subject to the high temperature. The permanent damage may not be readily apparent and may manifest later on as operational issues with DUT after the device gets operated in real-life applications. It may be advantageous to eliminate any destruction to the DUT resulting from such termination procedures.

Embodiments of the present invention relate generally to electronic devices, and more particularly to a structure and method of facilitating testing of an electronic device (device under test or DUT) using a non-permanent and reusable structure to properly terminate contact pads and contact pin holes where traditional terminating methods may not work effectively. Embodiments may not require soldering or drilling-in to provide properly termination of non-contacted pads and contact pin-holes thereby preventing potential damage to the DUT. Embodiments may be used to terminate contact pads and contact pin holes in a wide variety of electronic devices including integrated circuit (IC) chips, printed circuit boards (PCBs), glass ceramic package modules and organic package modules, among others.

Embodiments may provide a flexible and customizable termination feature that may be configured to match a particular contact pad spacing on a DUT. Embodiments may attach to any particular localized contact spacing area on a potentially large DUT without the need for an external means to provide attaching force. Embodiments may be used on a DUT that may include contact pads in a three dimensional configuration requiring termination attachments on top, bottom, and sides, and even hidden beneath or inside the DUT. Embodiments may also integrate with other traditional wafer probing structures and methods to work seamlessly in concert. Embodiments may not be as bulky as traditional terminating structures and may be moved from one localized area of the DUT to another area efficiently. Embodiments may take a lot less time to connect and disconnect compared with traditional structures and methods. Embodiments may be require minimal tools and may repetitively be connected and disconnected to several DUTs without damaging the DUTs, the probe tips of a wafer probe or the embodiments. Embodiments may provide effective and complete termination required for high frequency high bandwidth signal testing where even a small amount of signal leakage from the terminated contact pads and contact pin holes may distort test results. Embodiments may also be used with optical signal testing. While embodiments of the present invention are described below in termination application environments, they can also be used for providing a route for transmitting and receiving test signals in applications where it may be difficult for probes of a wafer probe to make direct contact with the contact pads and contact pin holes.

One embodiment of the invention may include conductive contact strips that may be kept connected to the contact pads on a surface of the DUT using a temporary suction force that may be provided by a combination of a non-conductive screw and a non-conducting suction mechanism. One embodiment may also include a retention apparatus which may include one or more alignment pins, instead of or in addition to the temporary suction force, for providing adequate alignment of the contact strips with the contact pads of the DUT. One embodiment may include a main platform constructed of non-conductive material incorporating one or more proper SMT components that may connect to the contact pads of the DUT via conductive wire strips. One embodiment may also include a combination of fiducials and features incorporated within its structure to assist in alignment of the contact strips with the contact pads of the DUT during placement. One embodiment may also include an additional screw mechanism attached to the non-conductive main platform to provide an ability to vary the contact pitch of the conductive wires depending on the unique characteristics of the DUT.

Embodiments of the present invention are described in detail below with reference to FIGS. 1-6.

Figure 1A:
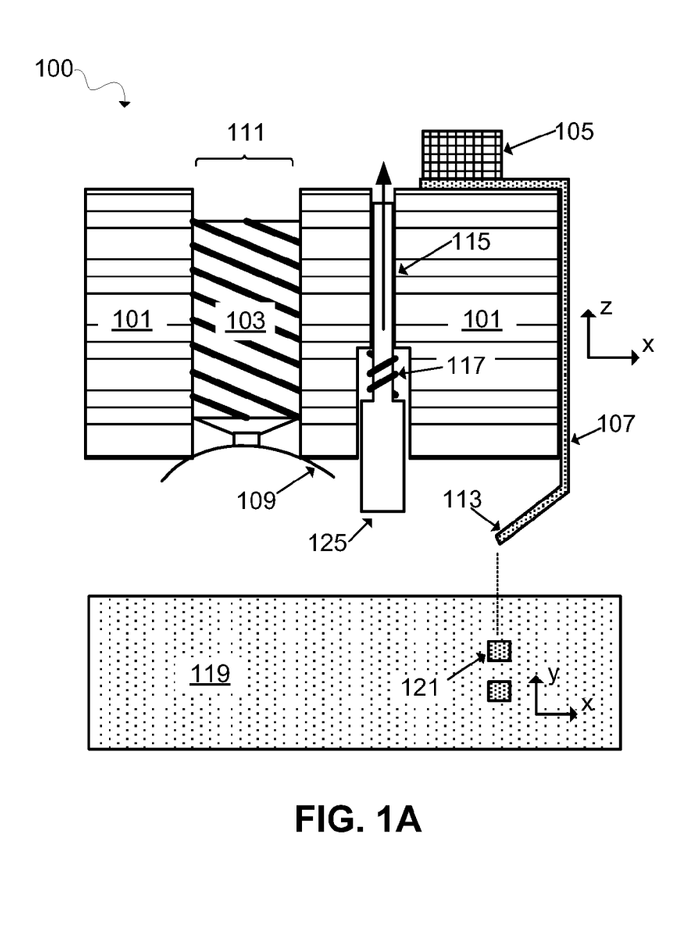
FIG. 1A illustrates a side view and FIG. 1B illustrates a front view respectively of a terminating device for terminating contact pads of an electronic device under test (DUT), according to an embodiment of the invention.
Figure 1B:
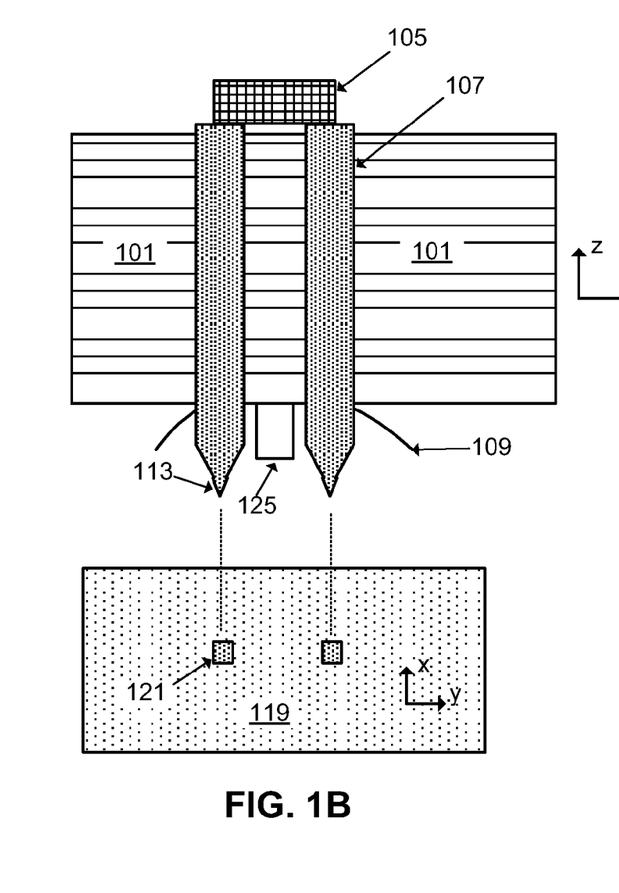

Referring now to FIGS. 1A and 1B, a side view and a front view illustrating a device 100 used to terminate contact pads and contact pin holes of an electronic device to facilitate microprobe testing is shown. The device 100 may illustrate one embodiment of a microprobe testing termination device used in testing an electronic device under test (DUT) 119.

In one embodiment, the device 100 includes a non-conductive platform 101, a non-conductive screw 103 that drives a non-conductive suction mechanism 109, one or more contact strips 107 each having a bent lower portion ending at a tip 113 and an upper end connected to one or more surface mount technology (SMT) device contact terminations (hereinafter "SMT terminations") 105, and a depth gage 125 that includes a spindle 115 and a spring 117.

DUT 119 may represent a device under test. DUT 119 may include a surface that may possess a certain degree of planarity to permit suction mechanism 109 to form an airtight fit with the DUT surface to facilitate proper termination of one or more contact pads 121 of the DUT 119. Contact pads 121 that may require termination to enable microprobes (not shown) to send signals through one or more contact pads (not shown) of the DUT 119 and measure the returning signals without unintended interferences and signal leakages that may result when contact pads 121 are not properly terminated. The contact pads 121 may typically be no larger than 1 mm on each side. Typical separation between the contact pads 121 may range between approximately 0.1 mm and approximately 2 mm.

The platform 101 includes a channel 111 housing the screw 103 that controls the suction force of the suction mechanism 109. In various embodiments, the platform 101 may be made from various non-conductive materials and constructions including single and multi-layer ceramic, resin, or epoxy glass laminate construction. The platform 101 may have a thickness varying between approximately 1 mm and approximately 10 mm. Geometry of platform 101 may be customized to correspond to a geometry of the DUT 119 being tested.

Device 100 includes one or more contact strips 107 that may be attached to a vertical surface (represented by z-axis) of the platform 101. An upper end of a contact strip 107 may be in electrical contact with one or more SMT terminations 105 and a lower portion of the contact strip 107 may extend below a lower surface of the platform 101, as shown in FIGS. 1A and 1B. The lower portion of the contact strip 107 may be bent to facilitate compression of the contact strip when downward force along the z-axis is applied on the contact strip to facilitate adequate electrical contact between a tip 113 of the contact strip 107 and the contact pad 121 of a device under test (DUT) 119. In some embodiments, the contact strip 107 may include two or more bends that allow the height of the contact strip 107 to change due to bending as compression pressure is applied to it. In one embodiment, the lower portion of contact strip 107 may be bent at approximately a sixty degree angle near the tip 113 such that the tip 113 extends in a direction generally away from a vertical side of the contact strip 107 and toward the contact pad 121 of the DUT 119.

The contact strips 107 may be composed of materials such as Cu, Al, Ni, Pd, Pt, Au, or alloys thereof. In one embodiment, contact strips 107 may be composed of copper. In one embodiment, contact strip 107 may represent a contact element with a rectangular cross-section or a square cross-section. In one embodiment, surfaces of the tips 113 may be plated with a noble metal such as gold, platinum, or palladium to prevent the surface of tip 113 from oxidizing. Each contact strip 107 may be of a length varying between approximately 1 mm and approximately 10 mm and a width between approximately 0.5 mm and approximately 1 mm, which may taper to a width between 50 µm and approximately 250 µm at the tip 113. The width of the contact strip 107 may vary depending on the characteristics of the contact pads 121 of the DUT 119 that the contact strip 107 is to make contact with. The width of the contact strip 107 may also be selected to minimize an impedance generated when the contact strip 107 makes electrical contact with the contact pad 121 of the DUT 119. A geometric distribution of the contact strips 107 may correspond to a geometric distribution of contact pads 121 of the DUT 119. This may allow each contact strip 107, and thereby a corresponding SMT termination 105, to be brought into electrically-conductive pressure contact with respective contact pads 121 of the DUT 119. In various embodiments, tip 113 may represent a sharp end or a blunt end depending on the DUT application. During testing, the tip 113 may be placed on the contact pad 121 under an adequate contact pressure. In one embodiment, contact strips 107 may be disposable, being replaced with a new set after the device 100 has been repeatedly used for testing multiple DUTs.

As stated earlier, the upper end of the contact strip 107 may be in electrical contact with one or more SMT terminations 105. The SMT termination 105 may be mounted on an upper surface of the platform 101, as shown in FIGS. 1A and 1B, and may be in electrical contact with the contact pad 121 via the contact strip 107. In one embodiment, a SMT termination 105 may be soldered to the upper end of the contact strip 107. The SMT device contact termination 105 may permit electrical contact between one or more SMT devices (not shown) and the contact pad 121. The SMT devices, which may include inductors, resistors and capacitors, among others, may operate to terminate electrical connections to contact pads 121 of DUT 119 that the contact strip 107 may be in electrical contact with. In one embodiment, the SMT devices may represent matched loads that operate to prevent a reflected signal from an original signal sent from a test probe (not shown) via a contact pad (not shown) separate from the terminated contact pads 121.

In one embodiment, the SMT devices may be replaced by active signaling devices, testing devices, or measuring devices. For example, the SMT devices may include a signal transmitting source and a signal receiving source. In such embodiments, SMT terminations 105 and contact strips 107 may represent a route through which signals can be sent to or received from the contact pads 121 of the DUT 119.

The screw 103 and the suction mechanism 109 provide a means of compressing contact strip 107 to facilitate an adequate level of electrical contact between the contact strip 107 and the contact pad 121 to accomplish adequate termination of the contacted contact pads, while probe testing is undertaken via other non-contacted contact pads (not shown) of the DUT 119. The suction mechanism 109 represents a means for providing temporary suction force and includes a stiff support member in rigid contact with the screw 103, and an elastically-deformable membrane. Both the support member and the membrane comprise dielectric material that may be in electrically-insulated relationship with the DUT 119 when suction mechanism 109 makes contact with the DUT 119. In one embodiment, the suction mechanism 109 may be composed of rubber or similar materials. The membrane of suction mechanism 109 has a first and a second main face, and is attached to an underside of the support member at its first main face. In one embodiment, suction mechanism may include a folded bellow set up. It should be understood that suction mechanism 109 may be of any shape necessary to adapt to the DUT's geometry. The suction cup and screw mechanism may reduce or eliminate electrical capacitive and inductive effects caused by inadequate contacts with the contact pads of the DUT.

Figure 2:
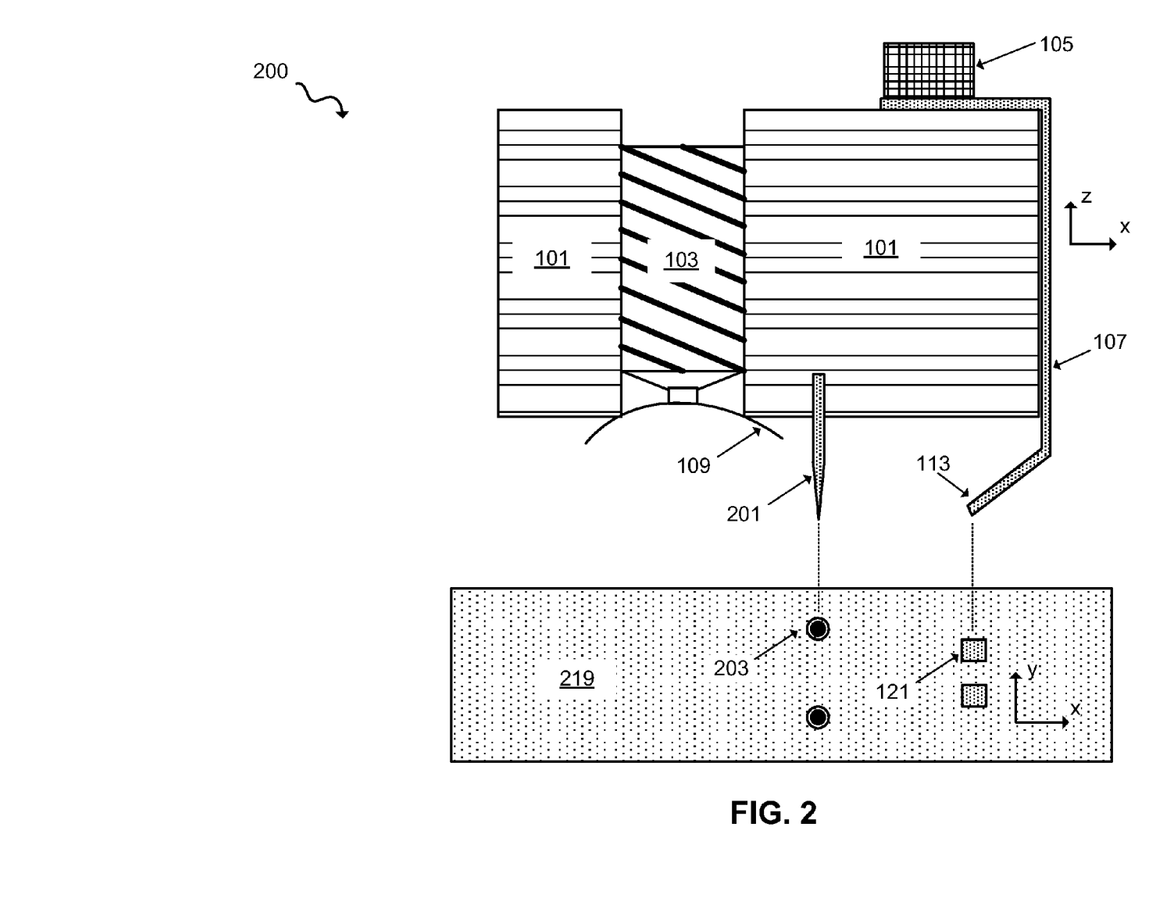
FIG. 2 illustrates a side view of another embodiment of the terminating device that includes one set of alignment pins aligned with pin holes on a surface of the DUT, according to an embodiment of the invention.

The screw 103 may be capable of moving up and down within the channel 111 of the platform 101 along the z-axis. Turning the screw 103 while suction mechanism 109 makes a substantially airtight hermetic seal on a surface of DUT 119 may cause the suction mechanism 109 to pull a vacuum. This in turn may reduce a relative vertical gap along the z-axis between the platform 101 and the surface of the DUT 119 that the suction mechanism 109 is temporarily attached to. This in turn may cause each alignment pin 201 to enter a corresponding pin hole 203 present on the surface of the DUT 219, and the contact strips 107 to make contact with the contact pad 121 and then bend due to compression pressure resulting in the tip 113 making adequate level of electrical contact with contact pads 121. In one embodiment, in lieu of the screw 103 and the suction mechanism 109, a clamping means (not shown) may be utilized to apply the needed compression pressure.

The depth gage 125 operates to detect and measure proper compression of the contact strips 107. Depth gage 125 may include a spring 117 and a spindle 115. In one embodiment, the depth gage 125 may represent a micrometer screw gage structure well known in the art. The spindle 115 of the depth gage 125 may be movable along a direction perpendicular to the surface of the platform 101. When the screw 103 is operated to draw platform 101 closer to the surface of DUT 119 along the z-axis, depth gage 125 may measure movement along the z-axis by the platform 101 and verify that a predetermined compression level suitable for signal transfer and testing has been reached by contact strip 107.

In one embodiment, one or more visual alignment ports (not shown) may be fabricated in the platform 101 and configured to facilitate an optical alignment of the contact strip 107 with the corresponding contact pad 121 of the DUT 119. The visual alignment port may permit viewing of the contact pad 121 such that the tip 113 of the contact strip 107 may be aligned and positioned directly over the corresponding contact pad 121 before the screw 103 is operated to bring the tip 113 in contact with the corresponding contact pad 121. In one embodiment, the visual alignment port may be covered with transparent material such as glass. In one embodiment, the visual alignment port may just comprise an opening in the platform 101.

In one embodiment, conventional pick and place equipment may be used to accurately place the DUT that is to be tested on receiver plate (not shown). The receiver plate may include a plurality of wells machined or etched into a top surface. The wells may be large enough so that the DUT can easily be placed in and removed from the wells, but not so large as to allow significant movement by the DUT once it is placed in the well. The device 100 may then be placed over the DUT and activities associated with terminating the contact pads may be commenced.

Device 100 may be advantageous in terminating contact pads compared to traditional approaches in that the platform 101 may be moved relative to DUT without the need for any complicated tools so as to make the contact pads of the DUT may engage the corresponding contact strips while one or more non-terminated contact pads of the same DUT may be contacted by test probes to send and receive signals through the non-terminated contact pads. After completion of the measurement of signals by the probes from one set of non-terminated contact pads, the device 100 may be moved to a different location on the DUT where a different set of contact pads may be terminated by the device 100, and the testing by test probes repeated.

Referring now to FIG. 2, a side view illustrating a device 200 used to terminate contact pads of an electronic device to facilitate microprobe testing is shown. The device 200 may illustrate an alternate embodiment of a microprobe testing termination device used in testing an electronic device under test (DUT) 219.

Device 200 may be substantially similar to device 100 depicted in FIGS. 1A and 1B except that it may exclude the depth gage 125 and include one or more optional alignment pins 201. The alignment pins 201 may provide mechanical support and facilitate proper alignment of the contact strips 107 with the contact pads 121 on a surface of a DUT 219 under test. Each alignment pin 201 may represent a fine needle protruding from a lower surface of the platform 101 in a direction parallel to the z-axis with a pointed end pointing downwardly to and directly above a pin hole 203 of the DUT 219. The alignment pins 201 may be composed of a metal such as Cu, Al, Ni, Pd, Pt, Au, or alloys thereof. An alignment pin 201 may fit into a pin hole 203 located on the surface of DUT 219, with a diameter of the alignment pin 201 being selected such that it may fit snug into a corresponding pin hole 203 located directly it.

Termination of contact pads 121 using device 200 may be performed as follows. The platform 101 may be placed such that each alignment pin 201 is positioned directly above corresponding pin hole 203 on the surface of the DUT 219. Then, similar to what was explained with reference with FIGS. 1A and 1B, the screw 103 and the suction mechanism 109 may be operated such that the suction force exerted by the suction mechanism 109 on the surface of DUT 219 results in the platform 101 being pulled closer to the surface of the DUT 219 to which the suction mechanism 109 is temporarily attached to. This in turn may cause each alignment pin 201 to enter a corresponding pin hole 203 on the surface of the DUT 219, and the contact strips 107 to make contact with the contact pad 121 and then bend due to compression pressure resulting in the tip 113 making adequate level of electrical contact with contact pads 121. It should be noted that the alignment pins 201 may be optional. The device 200 may be fabricated such that a geometry of the alignment pins 201 matches a geometry of the pin holes 203 on the surface of the DUT 219.

Figure 3:
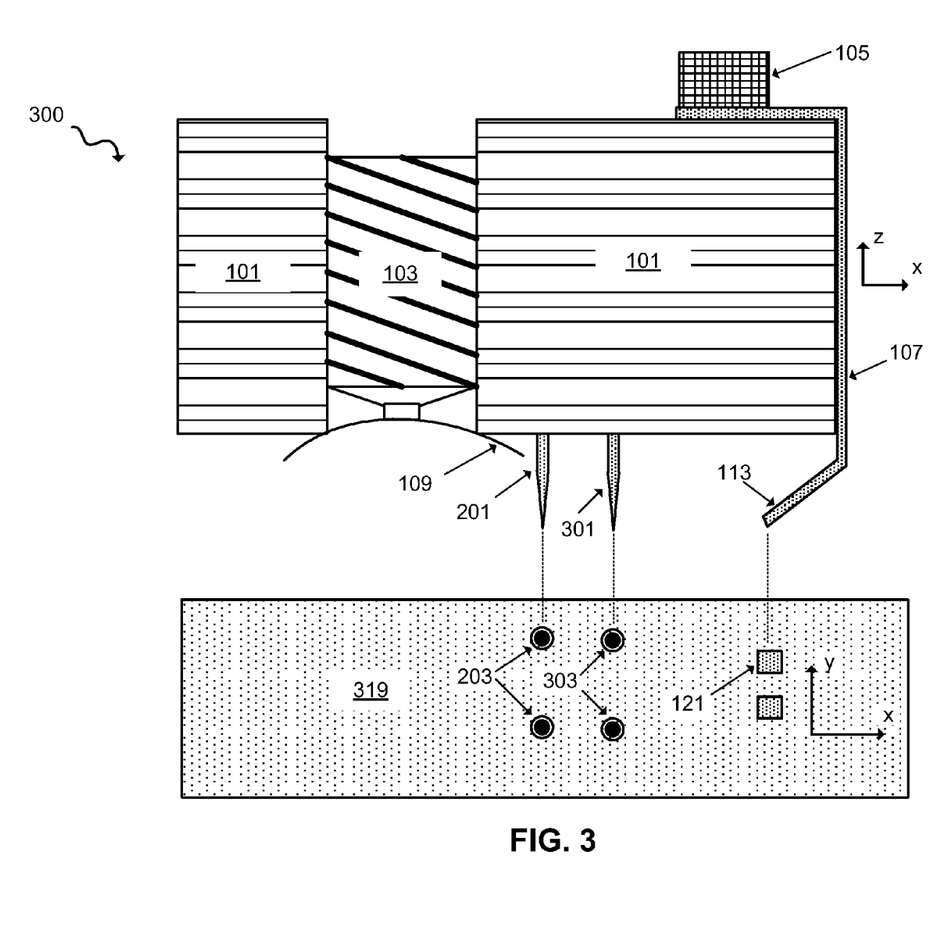
FIG. 3 illustrates a side view of another embodiment of the terminating device that includes two sets of alignment pins aligned with pin holes on the surface of the DUT, according to an embodiment of the invention.

Referring now to FIG. 3, a side view illustrating a device 300 used to terminate contact pads of an electronic device to facilitate microprobe testing is shown. The device 300 may illustrate an alternate embodiment of a microprobe testing termination device used in testing an electronic device under test (DUT) 319.

Device 300 may be substantially similar to device 200 depicted in FIG. 2 except that it may include a set of additional alignment pins 301. The additional alignment pins 301 may provide additional mechanical support and facilitate proper alignment of the contact strips 107 with the contact pads 121 on a surface of a DUT 319 under test. Each additional alignment pin 301 may be composed of substantially similar material as alignment pins 201. Each additional alignment pin 301 may fit into a respective additional pin hole 303 located on the surface of DUT 319, with a diameter of the additional alignment pin 301 being selected such that it may fit snug into a corresponding additional pin hole 303 located directly it. The mechanical support from the additional alignment pin 301 may render non-conductive screw 103 and non-conductive suction mechanism 109 optional.

Termination of contact pads 121 using device 300 may be performed as follows. The platform 101 may be placed such that each alignment pin 201 and each additional alignment pin 301 is positioned directly above a corresponding pin hole 203 and a corresponding additional pin hole 303, respectively on the surface of the DUT 319. Then, similar to what was explained with reference with FIG. 2, the screw 103 and the suction mechanism 109 may be operated such that the suction force exerted by the suction mechanism 109 on the surface of DUT 319 results in the platform 101 being pulled closer to a surface of the DUT 319 to which the suction mechanism 109 is temporarily attached to. This in turn may cause the alignment pins 201 and the additional alignment pins 301 to enter a corresponding pin hole 203 and a corresponding additional pin hole 303 on the surface of the DUT 319 and the contact strips 107 to make contact with the contact pad 121 and then bend due to compression pressure resulting in the tip 113 making adequate level of electrical contact with contact pads 121. It should be noted that the additional alignment pins 301 may be optional. The device 300 may be fabricated such that a geometry of the additional alignment pins 301 matches a geometry of the additional pin holes 303 on the surface of the DUT 319.

Figure 4:
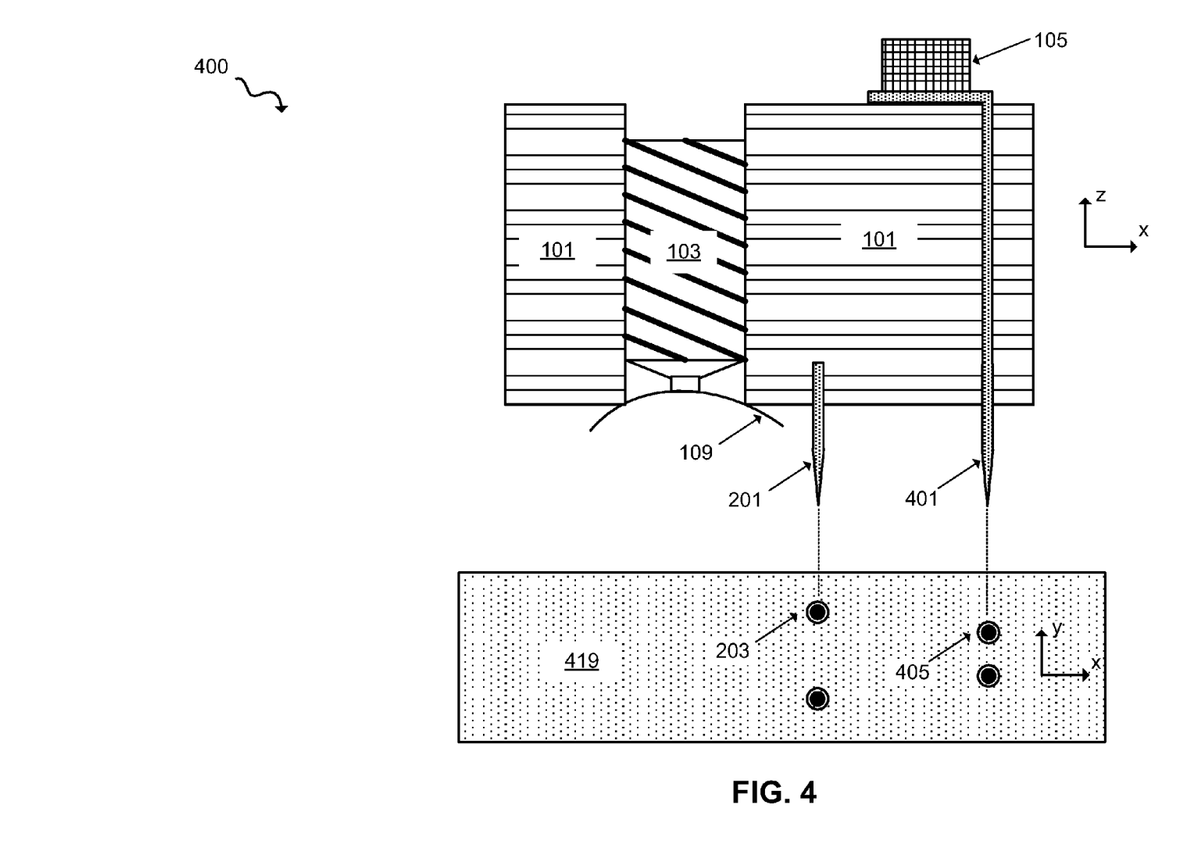
FIG. 4 illustrates a side view of another embodiment of the terminating device that includes one set of contact pins aligned with signal pin holes on the surface of the DUT, according to an embodiment of the invention.

Referring now to FIG. 4, a side view illustrating a device 400 used to terminate contact pin holes of an electronic device to facilitate microprobe testing is shown. The device 400 may illustrate an alternate embodiment of a microprobe testing termination device used in testing an electronic device under test (DUT) 419.

Device 400 may be substantially similar to device 100 depicted in FIG. 2 except that the contact strips 107 may be replaced by contact pins 401. A contact pin 401 may facilitate proper alignment with a signal pin hole 405 on a surface of a DUT 419 in addition to facilitating adequate electrical contact with the signal pin hole 405. Each contact pin 401 may represent a fine needle protruding from lower surface of the platform 101 in a direction parallel to the z-axis with its tapering pointed end pointing downwardly to a corresponding signal pin hole 405 on the surface of the DUT 419. The contact pins 401 may be composed of materials substantially similar to that of the contact strips 107 (FIGS. 1A and 1B). Each contact pin 401 may fit into a signal pin hole 405 located on the surface of DUT 419, with a diameter of the contact pin 401 being selected such that it may fit snug into a corresponding signal pin hole 405 located directly it. The tapering portion of each contact pin 401 may have thickness that depends on a final plated inner diameter of a via or other similar structure being tested. In one embodiment, contact pin 401 may represent a contact element with a circular cross-section. Typically the thickness of a contact pin may vary between approximately 0.2 mm thick and approximately 0.3 mm thick. The length of each contact pin 401 may be designed to ensure that its tip can maintain adequate electrical contact with a conducting surface within the contact signal pin holes 405 with application of a predefined force of contact by adjusting the screw 103.

Termination of contact signal pin holes 405 using device 400 may be performed as follows. The platform 101 may be placed such that a contact pin 401 is positioned directly above a corresponding signal pin hole 405 on the surface of the DUT 419. Then, similar to what was explained with reference with FIGS. 1A and 1B, the screw 103 and the suction mechanism 109 may be operated such that the suction force exerted by the suction mechanism 109 on the surface of DUT 419 results in the platform 101 being pulled closer to a surface of the DUT 419 to which the suction mechanism 109 is temporarily attached to. This in turn may cause a contact pin 401 to enter a corresponding signal pin hole 405 on the surface of the DUT 419 and a tip of the contact pin 401 to make adequate level of electrical contact within the corresponding signal pin hole 405. The device 400 may be fabricated such that a geometry of the contact pins 401 matches a geometry of the signal pin holes 405 on the surface of the DUT 419.

Figure 5:
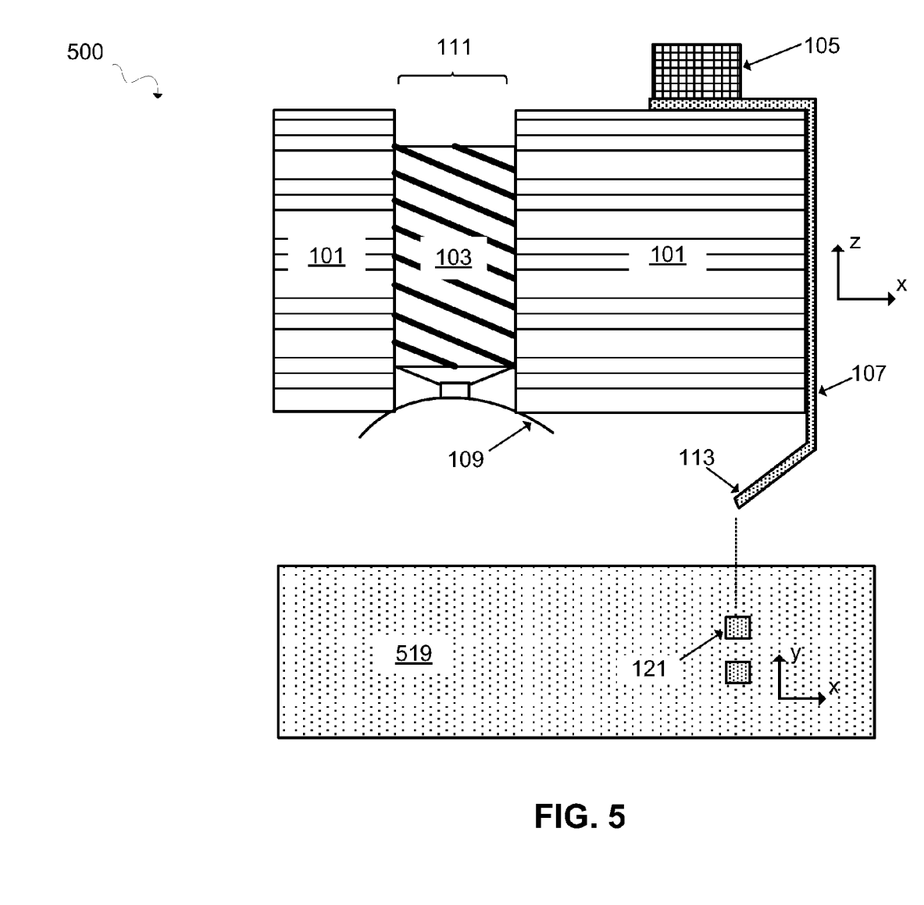
FIG. 5 illustrates a side view of another embodiment of the terminating device for terminating contact pads of the DUT that excludes a depth gage, according to an embodiment of the invention.

Referring now to FIG. 5, a side view illustrating a device 500 used to terminate contact pads of an electronic device to facilitate microprobe testing is shown. The device 500 may illustrate an alternate embodiment of a microprobe testing termination device used in testing an electronic device under test (DUT) 519.

Device 500 may be substantially similar to device 100 depicted in FIGS. 1A and 1B except that it may exclude the depth gage 125. Termination of contact pads 121 using device 500 may be performed as follows. The platform 101 may be placed such that a contact strip 107 is positioned directly above and aligned with a corresponding contact pad 121 on a surface of the DUT 519. Then, similar to what was explained with reference with FIGS. 1A and 1B, the screw 103 and the suction mechanism 109 may be operated such that the suction force exerted by the suction mechanism 109 on the surface of DUT 519 results in the platform 101 being pulled closer to a surface of the DUT 519 to which the suction mechanism 109 is temporarily attached to. This in turn may cause the contact strips 107 to make contact with the contact pad 121 and then bend due to compression pressure resulting in the tip 113 making adequate level of electrical contact with contact pads 121. The device 500 may be fabricated such that a geometry of the contact strips 107 matches a geometry of the contact pads 121 on the surface of the DUT 519.

Figure 6:
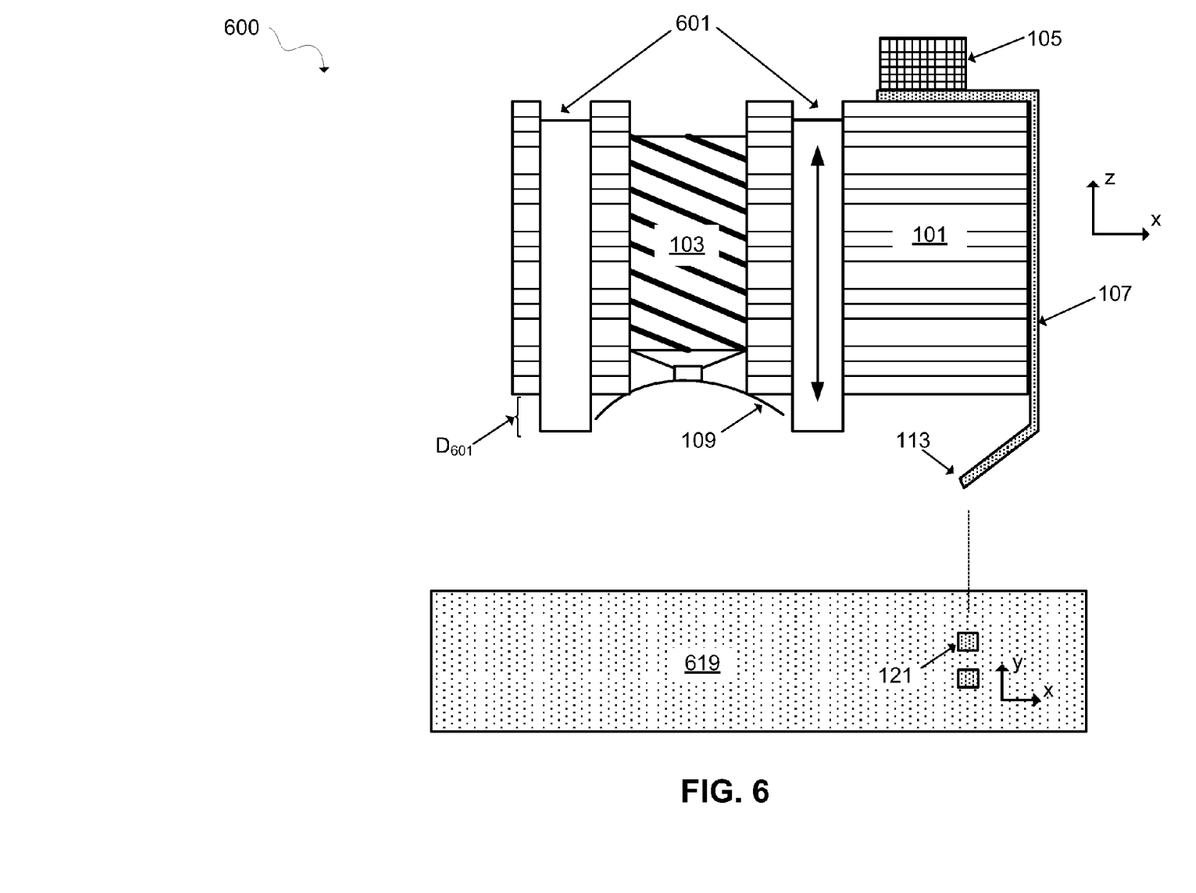
FIG. 6 illustrates a side view of another embodiment of the terminating device that includes an adjustable depth limiting mechanism, according to an embodiment of the invention.

Referring now to FIG. 6, a side view illustrating a device 600 used to terminate contact pads of an electronic device to facilitate microprobe testing is shown. The device 600 may illustrate an alternate embodiment of a microprobe testing termination device used in testing an electronic device under test (DUT) 619.

Device 600 may be substantially similar to device 100 depicted in FIGS. 1A and 1B except that the depth gage 125 may be replaced with two or more adjustable depth limiting members 601. In one embodiment, the adjustable depth limiting members 601 may represent cylindrical structures capable of sliding up and down vertically along the z-axis through channels created in the platform 101, and may include a screw mechanism and a spring mechanism (not shown). The adjustable depth limiting members 601 may operate to maintain a predetermined gap $D_{601}$ between a lower surface the platform 101 and an upper surface of the DUT 619. The adjustable depth limiting members 601 may limit a compression level of the contact strip 107 and may protect both the contact strip 107 and the contact pad 121 from unnecessary stress and damage, while the contact strip 107 simultaneously maintains adequate electrical contact with the contact pad 121. In one embodiment, adjustable depth limiting members 601 may not be capable of sliding up and down vertically along the z-axis but came fabricated to have a fixed depth $D_{601}$ below the lower surface of the platform 101 to maintain a predetermined vertical clearance along the z-axis between the platform 101 and a surface of the DUT 619.

Termination of contact pads 121 using device 600 may be performed as follows. The platform 101 may be positioned such that a contact strip 107 is positioned directly above a corresponding contact pad 121 on a surface of the DUT 619. The adjustable depth limiting members 601 may then be adjusted using an adjusting mechanism (not shown) to reach a predetermined vertical distance $D_{601}$ along the z-axis between the platform 101 and a surface of the DUT 619. Then, similar to what was explained with reference with FIGS. 1A and 1B, the screw 103 and the suction mechanism 109 may be operated such that the suction force exerted by the suction mechanism 109 on the surface of DUT 619 results in the platform 101 being pulled closer to a surface of the DUT 619 to which the suction mechanism 109 is temporarily attached to. This in turn may cause the contact strips 107 to make contact with the contact pad 121 and then bend due to compression pressure resulting in the tip 113 making adequate level of electrical contact with contact pads 121. If the screw 103 is adjusted beyond a level whereby the suction force exerted by the suction mechanism 109 on the surface of DUT 619 attempts to pull the platform 101 closer to the surface of the DUT 619 than the predetermined vertical distance $D_{601}$, adjustable depth limiting members 601 may prevent a vertical distance along the z-axis between the platform 101 and a surface of the DUT 619 to reach a level lower than $D_{601}$. The adjustable depth limiting members 601 may thus never allow the vertical distance along the z-axis between the platform 101 and a surface of the DUT 619 to get lower than the predetermined vertical distance $D_{601}$. The device 600 may be fabricated such that a geometry of the contact strips 107 matches a geometry of the contact pads 121 on the surface of the DUT 619.

While many examples discussed above relate to terminating contact pads to facilitate microprobe testing, one ordinarily skilled in the art would readily understand that this invention is broadly applicable to any kind of electrical connection, temporary or permanent, made between two or more devices. Therefore, the above embodiments are only examples of the invention that can be used and are not intended to limit the environments in which the invention can find application.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of terminating one or more electrical contact locations on an electronic device, the method comprising:
    forming a first electrical contact between a first end of a contact element mechanically coupled with a platform and a surface mount technology (SMT) component
    forming a second electrical contact between a second end of the contact element and an electric contact location on an electronic device,
    wherein a non-conductive vacuum suction membrane adheres to a surface of the electronic device by suction pressure to facilitate the second electrical contact,
    wherein the non-conductive vacuum suction membrane is mechanically coupled to an end of a non-conductive screw,
    wherein the screw has at least a portion housed within the platform; and
    measuring bending of the contact element using a depth gauge structure wherein the depth gauge structure is movable along a direction perpendicular to the surface of the platform, and wherein a measurement of movement of the depth gauge structure corresponds to a measurement of bending of the contact element.

2. The method of claim 1, further comprising:
    aligning an alignment pin mechanically attached to the platform with a pin hole present on the surface of the electronic device.

3. The method of claim 1, wherein the surface mount technology (SMT) component comprises one or more of:
    a signal transmitting source and a signal receiving source.

4. The method of claim 1, further comprising:
    measuring a gap between a surface of the platform and the surface of the electronic device using a depth gauge structure movable along a direction perpendicular to a surface of the platform.

5. The method of claim 1, further comprising:
    maintaining a predetermined level of bending of the second end of the contact element using one or more members protruding from a surface of the platform.

6. The method of claim 1, further comprising:
    optically aligning the contact element with the electric contact location on the electronic device using one or more visual alignment ports in the platform.

7. The method of claim 1, wherein the second end of the contact element is capable of bending.

8. A method of testing an electronic device, comprising:
    forming a first electrical contact between a first end of a contact element mechanically coupled with a platform and a surface mount technology (SMT) component;
    forming a second electrical contact between a second end of the contact element and a first electric contact location on an electronic device,
    wherein a non-conductive vacuum suction membrane adheres to a surface of the electronic device by suction force to facilitate the second electrical contact,
    wherein the non-conductive vacuum suction membrane is mechanically coupled to an end of a non-conductive screw,
    wherein the screw has at least a portion housed within the platform;
    sending an electrical pulse to a second electric contact location on the electronic device
    receiving a reflected response pulse corresponding to the sent electrical pulse; and
    measuring bending of the contact element using a depth gauge structure wherein the depth gauge structure is movable along a direction perpendicular to the surface of the platform, and wherein a measurement of movement of the depth gauge structure corresponds to a measurement of bending of the contact element.

9. The method of claim 8, further comprising:
    maintaining a predetermined level of bending of the second end of the contact element using one or more members protruding from a surface of the platform.

10. The method of claim 8, further comprising:
    maintaining a predetermined gap between the platform and the surface of the electronic device using a depth gauge structure movable along a direction perpendicular to a surface of the platform.

* * * * *